United States Patent
Bethoux et al.

(10) Patent No.: US 11,469,367 B2
(45) Date of Patent: Oct. 11, 2022

(54) METHOD FOR SEPARATING A REMOVABLE COMPOSITE STRUCTURE BY MEANS OF A LIGHT FLUX

(71) Applicant: Soitec, Bernin (FR)

(72) Inventors: Jean-Marc Bethoux, La Buisse (FR); Guillaume Besnard, Acigne (FR); Yann Sinquin, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/043,456

(22) PCT Filed: Mar. 22, 2019

(86) PCT No.: PCT/FR2019/050654
§ 371 (c)(1),
(2) Date: Sep. 29, 2020

(87) PCT Pub. No.: WO2019/186036
PCT Pub. Date: Oct. 3, 2019

(65) Prior Publication Data
US 2021/0028348 A1  Jan. 28, 2021

(30) Foreign Application Priority Data

Mar. 29, 2018 (FR) ...................... 1852715

(51) Int. Cl.
*H01L 21/30* (2006.01)
*H01L 41/335* (2013.01)
(Continued)

(52) U.S. Cl.
CPC ............ *H01L 41/335* (2013.01); *H01L 41/27* (2013.01); *H01L 41/312* (2013.01); *H01L 45/1641* (2013.01)

(58) Field of Classification Search
CPC ............ H01L 21/0272; H01L 21/0331; H01L 21/7813; H01L 21/30; H01L 41/331; H01L 51/0016
See application file for complete search history.

(56) References Cited

U.S. PATENT DOCUMENTS 9,679,777 B2    6/2017  Sinquin et al.
2004/0072382 A1  4/2004  Kelly et al.
(Continued)

FOREIGN PATENT DOCUMENTS

WO    2015/019018 A1    2/2015

OTHER PUBLICATIONS

European Communication pursuant to Article 94(3) EPC for European Application No. 19718440, dated Nov. 4, 2021, 6 pages.
(Continued)

*Primary Examiner* — Jae Lee
(74) *Attorney, Agent, or Firm* — TraskBritt

(57) ABSTRACT

A method for separating a removable composite structure using a light flux includes supplying the removable composite structure, which successively comprises: a substrate that is transparent to the light flux; an optically absorbent layer for at least partially absorbing a light flux; a sacrificial layer adapted to dissociate subject to the application of a temperature higher than a dissociation temperature and made of a material different from that of the optically absorbent layer; and at least one layer to be separated. The method further includes applying a light flux through the substrate, the light flux being at least partly absorbed by the optically absorbent layer, so as to heat the optically absorbent layer; heating the sacrificial layer by thermal conduction from the optically absorbent layer, up to a temperature
(Continued)

that is greater than or equal to the dissociation temperature; and dissociating the sacrificial layer under the effect of the heating.

21 Claims, 9 Drawing Sheets

(51) Int. Cl.
*H01L 41/27* (2013.01)
*H01L 41/312* (2013.01)
*H01L 45/00* (2006.01)

(56) References Cited

U.S. PATENT DOCUMENTS

| | | |
|---|---|---|
| 2004/0110395 A1 | 6/2004 | Ueda et al. |
| 2009/0053478 A1 | 2/2009 | Sakashita |
| 2009/0053877 A1 | 2/2009 | Bruel |
| 2013/0072009 A1 | 3/2013 | Bruel |
| 2020/0411803 A1* | 12/2020 | Kishimoto ............. H05B 33/10 |

OTHER PUBLICATIONS

International Search Report for International Application No. PCT/FR2019/050654 dated May 28, 2019, 2 pages.

International Written Opinion for International Application No. PCT/FR2019/050654 dated May 28, 2019, 5 pages.

\* cited by examiner

METHOD FOR SEPARATING A REMOVABLE COMPOSITE STRUCTURE BY MEANS OF A LIGHT FLUX

CROSS-REFERENCE TO RELATED APPLICATIONS

This application is a national phase entry under 35 U.S.C. § 371 of International Patent Application PCT/FR2019/050654, filed Mar. 22, 2019, designating the United States of America and published as International Patent Publication WO 2019/186036 A1 on Oct. 3, 2019, which claims the benefit under Article 8 of the Patent Cooperation Treaty to French Patent Application Serial No. 1852715, filed Mar. 29, 2018.

TECHNICAL FIELD

The present disclosure relates to a composite structure that can be dismantled by applying a light flux, and to a method for separating such a structure.

BACKGROUND

It is known practice, in the field of microelectronics, optics and optoelectronics, to produce a dismantlable composite structure comprising a useful layer and a substrate, the structure being intended to be subsequently treated in order to separate the useful layer from the substrate.

This is the case, for example, when the substrate is a growth substrate for the formation by epitaxy of the useful layer, and when it is then desired to separate the useful layer from the substrate in order to use it alone or to transfer it to a final carrier.

To this end, there is arranged within the structure, between the useful layer and the substrate, a sacrificial layer which is intended to be at least partly broken down during the separation treatment.

One particular separation technique is known under the term "laser lift-off" (LLO), in which a light flux is used to break down the sacrificial layer. This technique takes advantage of the differences in optical absorption and temperature resistance properties of the materials forming the structure. Thus, the substrate is substantially transparent to the light flux, while the sacrificial layer strongly absorbs the flux. Consequently, when the composite structure is irradiated by applying the light flux through the substrate, the sacrificial layer heats up substantially and then dissociates when the temperature exceeds a given temperature, called the dissociation temperature. What is thus obtained is the useful layer on the one hand and, on the other hand, the substrate, which may be reused, for example, to form a new composite structure.

One drawback of this method is that due to the proximity between the layer to be separated and the sacrificial layer, the layer to be separated may also be raised to a high temperature by thermal conduction from the sacrificial layer. Such heating of the layer to be separated may result in a degradation of some of its properties, in particular, in the case where the substrate and the layer to be separated have substantially different coefficients of thermal expansion.

Document WO 2015/019018 describes a dismantlable composite structure in which a thermal barrier layer is interposed between the sacrificial layer and the layer to be separated. The thermal barrier layer is substantially transparent to the light flux so as not to heat up and is thick enough to maintain the layer to be separated at a temperature below a determined threshold for the duration of the exposure to the light flux.

However, for certain materials of the layer to be separated and/or of the final carrier where applicable, such a thermal barrier layer may not be sufficient.

Thus, for example, in the case where the layer to be separated comprises a stack of ferromagnetic materials such as CoFeB/MgO, an interdiffusion of the atoms takes place from a temperature of about 400 to 600° C. In the case where the layer to be separated is made of graphene, a degradation of the electrical properties takes place from a temperature of 600° C. In the case of a layer to be separated made of molybdenite ($MoS_2$), a modification of the hybridization and a reaction with other materials may take place from a temperature of about 450 to 600° C. In the case where the layer to be separated is made of a phase-change alloy, such as GeSbTe, melting and a transition to the amorphous phase take place from about 600° C.

Likewise, depending on the composition of the final carrier to which the layer to be separated is to be transferred, the carrier may be affected by the thermal budget applied in order to dissociate the sacrificial layer. Thus, for example, if the final carrier comprises electronic circuits containing copper, extrusion of the copper lines may take place from 400° C. In the case where the final carrier is made of a polymer material (for example, a plastic material), it may decompose from 200° C.

In such cases, in order to carry out the separation at low temperature, one possible technique is to remove the substrate via an etch from the rear face of the layer to be separated, in such a way that the substrate cannot be recycled for another use.

Another conceivable method based on the LLO technique, when the final carrier is sensitive to temperature, is to transfer the layer to be separated to a temporary substrate, which is not liable to be affected by the thermal budget for dissociation of the sacrificial layer, then to transfer the layer to be separated to the final carrier. However, this method takes longer and is more expensive than the LLO method since it requires that the layer of interest be transferred twice.

BRIEF SUMMARY

An object of the present disclosure is to overcome the aforementioned drawbacks and, in particular, to design a dismantlable composite structure comprising a sacrificial layer capable of dissociating through the application of a limited thermal budget (typically corresponding to a temperature of lower than 500° C.) generated through the absorption of a light flux.

To this end, the present disclosure proposes a composite structure that can be dismantled by means of a light flux, comprising successively:
  a substrate,
  an optically absorbent layer made of a material suitable for at least partially absorbing a light flux, the substrate being substantially transparent to the light flux,
  a sacrificial layer suitable for dissociating under the application of a temperature higher than a dissociation temperature, made of a material different from that of the optically absorbent layer,
  at least one layer to be separated.

The term "composite" is understood to mean that the structure is formed of a stack of different materials, exhibiting, in particular, different properties in terms of optical absorption and temperature resistance.

The term "dismantlable" is understood to mean that the composite structure is capable of separation along a plane parallel to its main surfaces, into two parts, which each retain their integrity, with the exception of a sacrificial layer, which is located at the interface between the two parts and which dissociates to allow the separation.

The term "substantially transparent material" is understood to mean a material that allows at least 90% of the light flux that it receives to pass. In other words, the product of the thickness of the material and of the coefficient of absorption of the light flux by the material is less than 0.1.

The term "optically absorbent material" is understood to mean a material that absorbs at least 90% of the light beam that it receives. In other words, the product of the thickness of the material and of the coefficient of absorption of the light flux by the material is greater than 2.3. The optical absorption coefficient, at the wavelength of the light flux, is preferably greater than $10^5$ cm$^{-1}$.

The terms "on" and "between" referring to the relative position of two layers do not necessarily imply direct contact between the layers, unless such contact is specified.

By providing a sacrificial layer that is distinct from the optically absorbent layer, in comparison with the known method in which the sacrificial layer is merged with the optically absorbent layer, the composite structure according to the present disclosure has several advantages. Specifically, the thickness of the sacrificial layer may be minimized. Because of this, the amount of heat present after dissociation of the layer on the side of the layer to be separated will be lower. In addition, the sacrificial layer itself contributes to distancing the optically absorbent layer from the layer to be separated. As a result, the composite structure may be separated using a lower thermal budget, which allows the use of a layer to be separated and/or of a final carrier, which are sensitive to temperature as mentioned above.

According to other advantageous but optional features of the structure, considered alone or in combination when this is appropriate:

- the sacrificial layer is in contact with the optically absorbent layer;
- the sacrificial layer is made of a material that is substantially transparent to the light flux;
- the structure further comprises a first thermal barrier layer that is substantially transparent to the light flux, between the substrate and the optically absorbent layer;
- the structure further comprises a second thermal barrier layer between the sacrificial layer and the layer to be separated;
- the first and/or the second thermal barrier layer has a linear thermal conductivity coefficient of less than 10 W m$^{-1}$ K$^{-1}$;
- the first and/or the second thermal barrier layer comprises at least one of the following materials: silica (SiO$_2$), alumina (Al$_2$O$_3$);
- the structure further comprises a first film suitable for reflecting or absorbing the light flux, between the sacrificial layer and the layer to be separated;
- the first film comprises at least one of the following materials: silicon, silica (SiO$_2$), silicon carbide (SiC), molybdenum, silicon nitride (Si$_3$N$_4$);
- the structure further comprises, between the sacrificial layer and the layer to be separated, a second film suitable for distributing the heat over the entire area of the structure;
- the second film comprises at least one of the following materials: alumina (Al$_2$O$_3$), silica (SiO$_2$), polycrystalline aluminum nitride (AlN), polycrystalline silicon;
- the substrate comprises at least one of the following materials: sapphire, quartz;
- the optically absorbent layer comprises at least one of the following materials: silicon nitride (Si$_3$N$_4$), polycrystalline silicon, polycrystalline silicon carbide (SiC);
- the sacrificial layer comprises at least one of the following materials: silicon nitride (Si$_3$N$_4$), polycrystalline aluminum nitride (AlN), polycrystalline gallium nitride (GaN), indium tin oxide (ITO);
- the layer to be separated comprises at least one of the following materials: a metal, such as copper; a group IV material having a hexagonal crystal structure, such as graphene; a piezoelectric, ferromagnetic or ferroelectric material; a phase-change alloy, such as GeSbTe.

Another subject of the present disclosure relates to a method for separating a dismantlable composite structure such as described above.

The method comprises:

- applying a light flux through the substrate, the light flux being absorbed at least in part by the optically absorbent layer, so as to heat the optically absorbent layer,
- heating the sacrificial layer by thermal conduction from the optically absorbent layer, up to a temperature higher than or equal to the dissociation temperature,
- dissociating the sacrificial layer under the effect of the heating.

According to other advantageous but optional features of the method, considered alone or in combination when this is appropriate:

- the product of the thickness of the substrate and of the coefficient of absorption of the light flux by the substrate is less than 0.1;
- the product of the thickness of the optically absorbent layer and of the coefficient of absorption of the light flux by the layer is greater than 2.3;
- the light flux is applied in a pulsed manner;
- the wavelength of the light flux is between 100 and 12,000 nm;
- before the application of the light flux, the method comprises a step of bonding the composite structure to a carrier, the dissociation of the sacrificial layer leading to the transfer of the layer to be separated to the carrier;
- the carrier comprises at least one of the following materials: a semiconductor material, such as silicon; a metal, such as copper; a polymer.

Another subject of the present disclosure relates to a method for producing a dismantlable composite structure such as described above. The method comprises the following steps:

- providing the substrate,
- forming, on the substrate, an optically absorbent layer made of a material suitable for at least partially absorbing a light flux, the substrate being substantially transparent to the light flux,
- forming the layer to be separated on the optically absorbent layer,
- the method being characterized in that it comprises the formation of the sacrificial layer between the optically absorbent layer and the layer to be separated, the sacrificial layer being made of a material different from that of the optically absorbent layer.

Advantageously, the formation of the layer to be separated is implemented at a temperature lower than the dissociation temperature of the sacrificial layer.

The formation of the layer to be separated may comprise the deposition or the bonding of the layer on or to a seed layer. The seed layer may comprise at least one of the following materials: platinum, nickel, copper.

BRIEF DESCRIPTION OF THE DRAWINGS

Other features and advantages of the present disclosure will emerge from the detailed description that follows, with reference to the appended drawings, in which.

For the sake of legibility of the figures, the illustrated elements are not necessarily shown to scale. Moreover, elements denoted by the same reference signs in the various figures are identical.

DETAILED DESCRIPTION

The context of the present disclosure is that of the separation of a composite structure through the dissociation of a layer of the structure under the effect of heating caused by the application of a light flux through at least part of the structure.

In comparison with the structure described in the aforementioned document WO 2015/019018, the present disclosure proposes decoupling the portion of the structure that is heated by optical absorption from the portion of the structure that dissociates under the effect of the heating by forming, in the structure, an optically absorbent layer that is distinct from the sacrificial layer. In particular, unlike the optically absorbent layer, the sacrificial layer is made of a material that is substantially transparent to the light flux and capable of dissociating under the application of a temperature higher than a dissociation temperature, the temperature being reached by heating the optically absorbent layer through the absorption of the light flux.

Figure 1A:
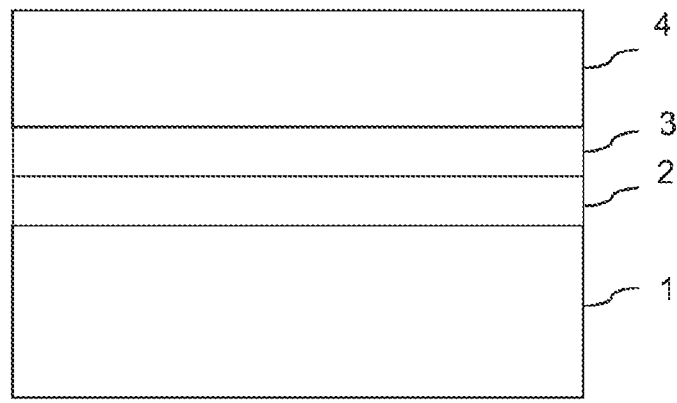
FIGS. 1A and 1B schematically illustrate a dismantlable composite structure according to two embodiments of the present disclosure.

In general, as illustrated in FIG. 1A, the composite structure 100 successively comprises at least one substrate 1 that is substantially transparent to the light flux, the optically absorbent layer 2, the sacrificial layer 3 and a layer 4 (or a stack of layers) to be separated from the rest of the structure.

The irradiation by the light flux is performed through the face of the substrate opposite the layer to be separated. Specifically, the layer to be separated is not necessarily transparent to the light flux; however, heating caused by at least partial absorption of the light flux could damage the layer to be separated. The sacrificial layer 3 is interposed between the optically absorbent layer 2 and the layer to be separated 4. Thus, the sacrificial layer 3 contributes to forming a thermal barrier between the optically absorbent layer 2, which heats up substantially by absorbing the light flux, and the layer to be separated 4.

Preferably, the sacrificial layer 3 is in contact with the absorbent layer 2, so as to maximize the heat transfer from the absorbent layer 2 to the sacrificial layer 3.

The substrate 1 is chosen from a material that is substantially transparent to the light flux to be applied in order to dissociate the sacrificial layer 3.

Advantageously, the substrate 1 may be a bulk substrate or consist of a stack of layers of different materials, as long as each of the materials is substantially transparent to the light flux.

According to a preferred embodiment, the substrate 1 comprises at least one of the following materials: sapphire or quartz.

The material of the optically absorbent layer 2 is chosen so as to be highly absorbent at the wavelength of the light flux.

Advantageously, the optically absorbent layer 2 comprises at least one of the following materials: silicon nitride ($Si_3N_4$), polycrystalline silicon, polycrystalline silicon carbide (SiC), or molybdenum (Mo).

The sacrificial layer 3 is a layer that is distinct from the layer 2, and is advantageously made of a material that is substantially transparent to the light flux. The material of the sacrificial layer 3 is chosen so as to start dissociating from what is called a dissociation temperature. Starting from this dissociation temperature, decohesion of the chemical bonds of the material of the sacrificial layer 3 is observed, leading to separation of the composite structure 100 at the sacrificial layer 3. The material of the optically absorbent layer 2, on the other hand, is stable to a temperature above the dissociation temperature.

Advantageously, the sacrificial layer 3 comprises at least one of the following materials: silicon nitride ($Si_3N_4$), polycrystalline aluminum nitride (AlN), polycrystalline gallium nitride (GaN), or indium tin oxide (ITO). The dissociation temperature of these different materials is generally between 1000 and 2500° C.

The sacrificial layer 3 is not substantially heated by absorbing the light flux, but through thermal conduction from the optically absorbent layer 2. Since the sacrificial layer 3 begins to dissociate as soon as the temperature to which it is exposed reaches the dissociation temperature of the layer 3, the thermal budget applied to the layer 4 to be separated is lower than the thermal budget, which would be applied to the layer 4 if it were in contact with the optically absorbent layer 2.

Furthermore, using two distinct layers for optical absorption and dissociation means that a relatively thin sacrificial layer 3 (thinner than the sacrificial layer of the prior art) can be used. Specifically, while in the case where the sacrificial layer 3 is merged with the optical absorption layer 2, the sacrificial layer 3 must be thick enough (typically, on the order of a few hundred nanometers) to store the heat required for its own dissociation. The only function of the sacrificial layer 3 is to start to break down from a certain temperature and it may therefore be very thin (on the order of a few tens of nanometers).

Since the present disclosure makes it possible to decrease the thermal budget of the layer 4 to be separated, the layer 4 may be formed from a wide variety of materials.

For example, the layer 4 to be separated advantageously comprises at least one of the following materials: a metal, such as copper; a group IV material having a hexagonal crystal structure, such as graphene; a piezoelectric, ferromagnetic or ferroelectric material; or a phase-change alloy, such as GeSbTe, for example.

The composite structure 100 may be obtained by successively growing the constituent layers on the substrate 1. Certain steps in the production of the composite structure 100 may also include layer transfer or bonding steps.

In any event, the dissociation temperature of the sacrificial layer 3 must be higher than the temperature at which the layer 4 to be separated is deposited or bonded, in order to avoid any untimely dissociation of the sacrificial layer 3 during the production of the composite structure 100.

The composite structure 100 may advantageously comprise one or more additional layers, used alone or in combination, which produce the additional effects described below with reference to FIG. 1B.

Figure 1B:
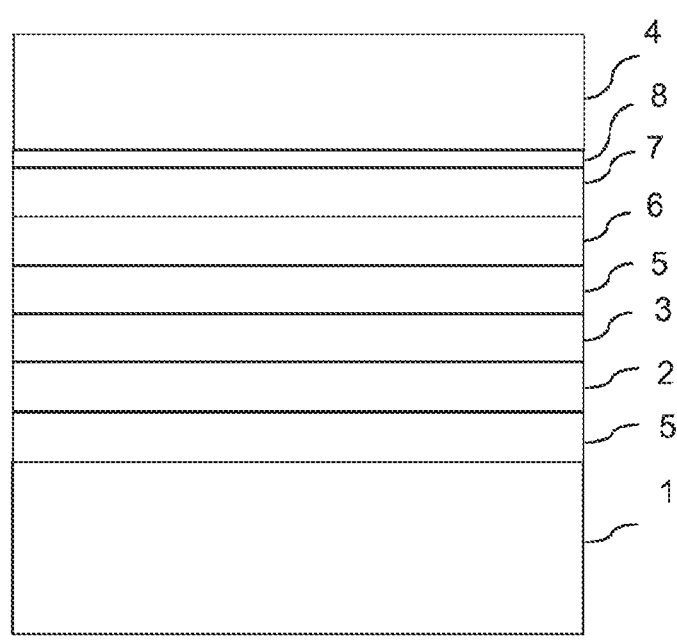

FIG. 1B illustrates an embodiment that combines all of these additional functional layers, but, as indicated above, the composite structure 100 could comprise only some of these layers, as long as it comprises at least the layers described with reference to FIG. 1A.

Between the substrate 1 and the optically absorbent layer 2 is arranged a first layer 5 forming a thermal barrier. The layer 5 is made of a material that is substantially transparent to the light flux and exhibits low thermal conductivity. The term "low thermal conductivity" is understood in the present text to mean a linear thermal conductivity coefficient of less than 10 $W \cdot m^{-1} \cdot K^{-1}$.

A second thermal barrier layer 5 is arranged on the sacrificial layer 3. Since the layer 5 is made of a material with low thermal conductivity, it makes it possible to improve the thermal insulation of the layer 4 to be separated.

Advantageously, each of the layers 5 comprises at least one of the following materials: silica ($SiO_2$) or alumina ($Al_2O_3$).

The layers 5 make it possible to confine the heat to the portion of the composite structure 100 that they delimit, namely the optically absorbent layer 2 and the sacrificial layer 3. Thus, the dissociation temperature of the sacrificial layer 3 is reached more quickly than in the absence of the thermal barrier layers 5.

A film 6 (or a stack of films) suitable for reflecting the light flux, or for absorbing the part of the flux transmitted through the optically absorbent layer, is arranged on the second thermal barrier layer 5.

The film 6 advantageously comprises at least one of the following materials: silicon, silica ($SiO_2$), silicon carbide (SiC), molybdenum, or silicon nitride ($Si_3N_4$). The film 6 may advantageously comprise a Bragg mirror-type stack. The stack may optionally perform the function of a thermal barrier and thus replace the second layer 5.

The film 6 makes it possible to prevent part of the light flux from being transmitted to the layer 4 to be separated, which has the effect of decreasing the thermal budget applied to the layer 4 and of avoiding energy losses.

Furthermore, a film 7 (or a stack of films) exhibiting a certain thermal inertia and suitable for distributing the heat over the entire area of the structure is arranged on the film 6.

The film 7 is characterized by a product thickness× density×specific heat capacity.

The film 7 comprises at least one of the following materials: alumina ($Al_2O_3$), silica ($SiO_2$), polycrystalline aluminum nitride (AlN), or polycrystalline silicon.

Finally, a seed layer 8 is arranged on the film 7, in direct contact with the layer 4 to be transferred. The seed layer 8 is chosen so as to facilitate the bonding or the deposition of the layer 4 to be separated, depending on the way in which the layer 4 is formed.

The seed layer 8 may comprise at least one of the following materials: platinum, nickel, or copper.

In the case where the layer 4 to be separated is to be transferred to a carrier with a view to later use, the composite structure 100 is joined to the carrier by means of the layer 4 to be separated. The decrease in the separation thermal budget described above is also beneficial to the carrier, in particular, if the latter is sensitive to temperature. The present disclosure therefore also makes it possible to use a greater variety of carriers, in particular, made of polymer material or of metal.

In general, the carrier may comprise at least one of the following materials: a semiconductor material, such as silicon; a metal, such as copper; or a polymer.

Figure 2:
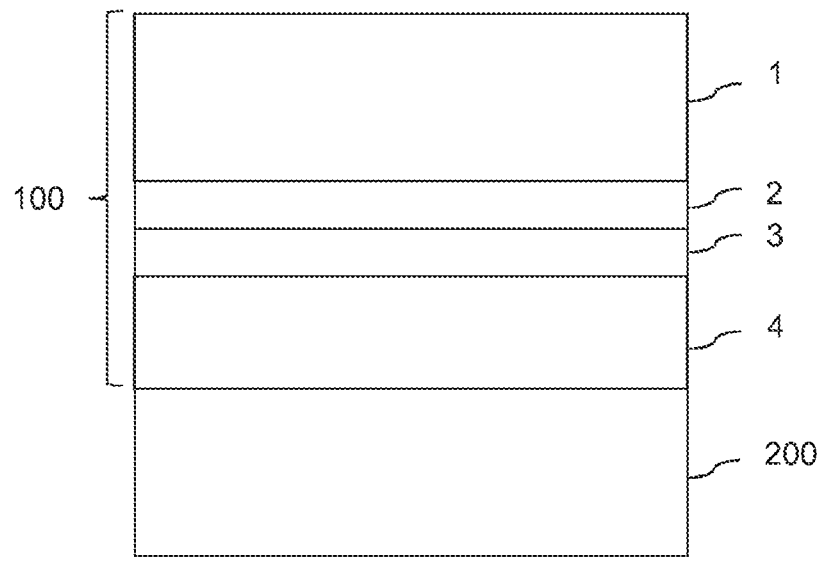
FIG. 2 schematically illustrates the bonding of the structure of FIG. 1A to a carrier.

FIG. 2 illustrates the bonding of the composite structure 100 of FIG. 1A to a carrier 200. The bonding may be preceded by any suitable surface preparation step with a view to strengthening the bonding energy. Alternatively, the carrier 200 may be deposited on the layer 4 to be separated, provided that the thermal budget implemented for this deposition is sufficiently low so as not to cause dissociation of the sacrificial layer 3.

Figure 3:
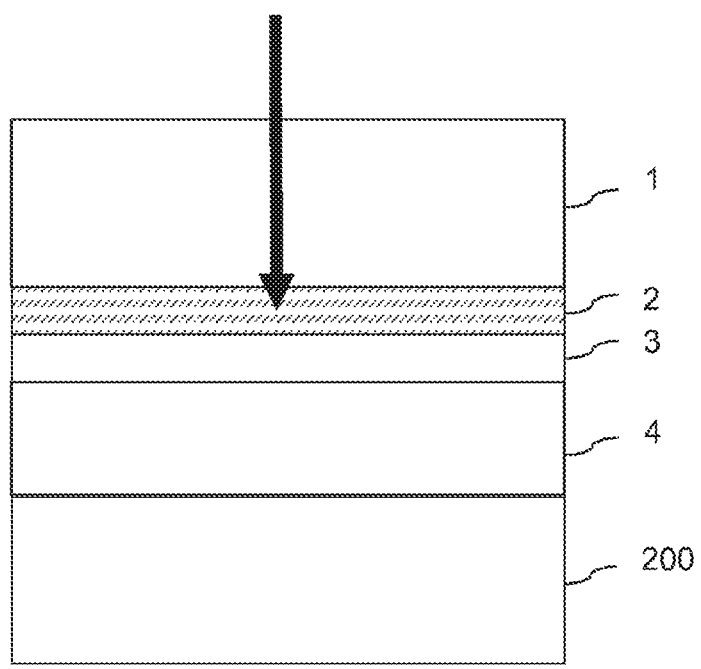
FIG. 3 schematically illustrates the application of a light flux to the dismantlable composite structure bonded to the carrier.

FIG. 3 schematically illustrates the irradiation of the composite structure 100 bonded to the carrier 200 by a laser beam (represented by the arrow). The beam passes through the substrate 1 (and, where applicable, the first thermal barrier layer 5) and is absorbed by the optically absorbent layer 2, which heats up.

Advantageously, the light flux is applied in a pulsed manner. The duration of each pulse is of the order of a few tens of nanoseconds. This duration is chosen according to the power of the laser and the temperature to be reached in the optically absorbent layer 2 in order to be able to dissociate the sacrificial layer 3.

The wavelength of the laser is chosen in relation to the materials of the layers constituting the composite structure 100. In particular, the substrate 1 and the one or more thermal barrier layers 5, and the sacrificial layer 3, are substantially transparent at the wavelength of the laser, unlike the optically absorbent layer 2.

In general, the wavelength of the laser may be between 100 and 12,000 nm. For a quartz substrate 1, the wavelength of the laser is advantageously on the order of 150 to 700 nm. For a silicon substrate 1, the wavelength of the laser is advantageously on the order of 1,000 to 12,000 nm.

Figure 4:
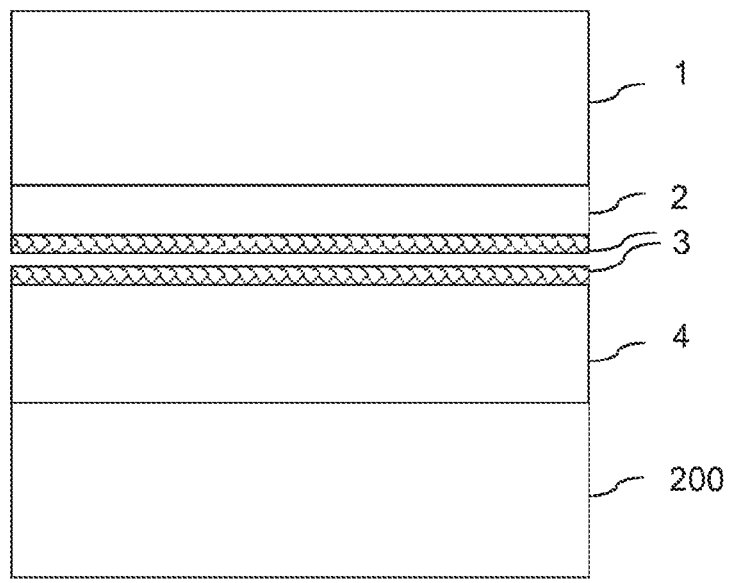
FIG. 4 schematically illustrates the separation of the composite structure following the dissociation of the sacrificial layer.

With reference to FIG. 4, the sacrificial layer 3 dissociates under the effect of the heat generated in the electrically absorbent layer 2. The composite structure 100 therefore separates into two parts: a first part, which comprises the substrate 1 and the optically absorbent layer 2, on the one hand, and a second part, which comprises the layer 4 to be separated, on the other hand. Residues of the sacrificial layer 3 may be found on one and/or the other of the two parts. A finishing treatment may optionally be implemented in order to remove these residues.

Figure 5:
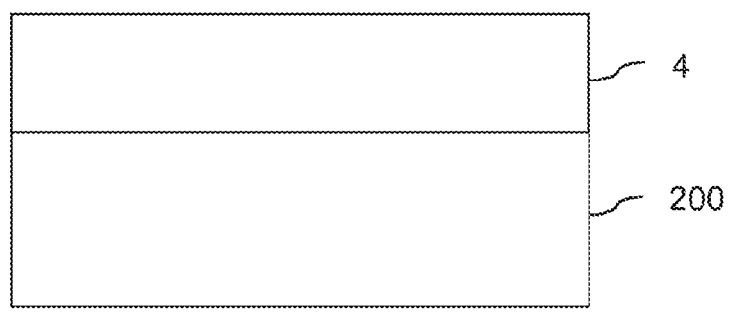
FIG. 5 schematically illustrates the structure obtained on completion of the separation, comprising the layer to be separated transferred to the carrier.

FIG. 5 illustrates the layer 4 transferred to the carrier 200.

Example n° 1

This first example relates to a composite structure for the growth of a layer of graphene to be transferred to a carrier.

The composite structure comprises successively, with reference to FIG. 1B (it should be noted that not all of the layers shown in FIG. 1B are present in the structure):
- a substrate 1 of sapphire 500 µm thick;
- a first thermal barrier layer 5 made of $SiO_2$ 500 nm thick;
- an optically absorbent layer 2 made of silicon carbide (SiC) 30 nm thick;
- a sacrificial layer 3 made of silicon nitride ($Si_3N_4$) 20 nm thick;
- a second thermal barrier layer 5 made of $SiO_2$ 1,000 nm thick;
- a seed layer 8 of nickel 50 nm thick.

When the structure is subjected to a beam from a pulsed laser emitting at 193 nm, with a pulse duration of 20 ns and a fluence of approximately 0.1 $J \cdot cm^{-2}$, through the substrate 1, the temperature within the structure increases over the duration of each pulse. The heat generated is mainly localized in the optically absorbent layer 2. When the temperature reaches the dissociation temperature of silicon nitride (i.e., around 1900° C.), part of the sacrificial layer 3, the second thermal barrier layer 5 and the seed layer 8 become detached from the substrate 1 and from the first thermal barrier layer 5.

After a laser pulse, the temperature homogenizes in the structure. Of particular interest is the temperature at the upper interface of the seed layer 8, that is to say the interface between the seed layer 8 and the graphene layer 4.

Figure 6A:
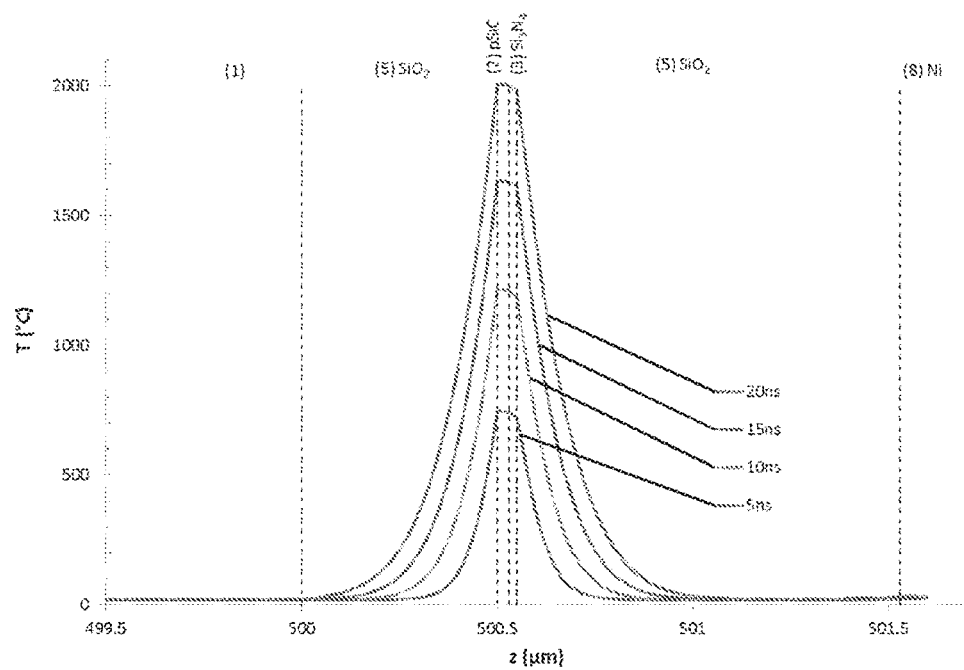
FIGS. 6A to 6C show thermal simulation results showing, respectively, the heating within the dismantlable composite structure during a pulse of the light flux and the homogenization of the temperature within the composite structure after the dissociation of the sacrificial layer, for different durations after the laser pulse and the dissociation of the sacrificial layer, and the change in temperature at the seed layer over time, during and after a pulse of the light flux, for a first type of composite structure.

FIG. 6A shows the distribution of the temperature within the composite structure as a function of the depth z (in µm) for different durations shorter than or equal to the laser pulse duration, which is 20 ns in this case.

Figure 6B:
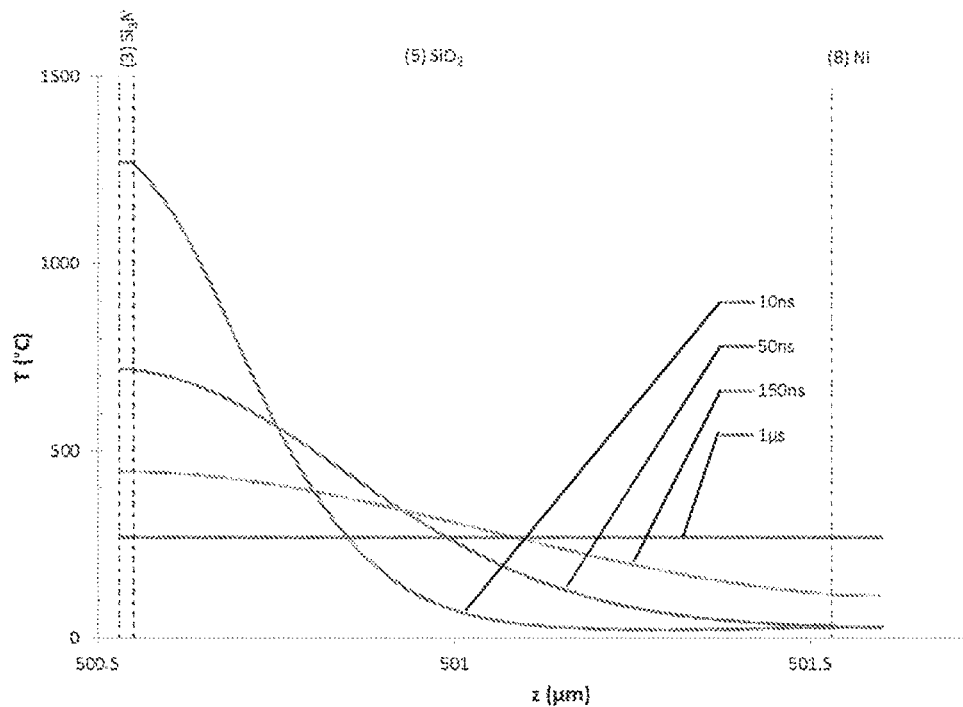

FIG. 6B shows the homogenization of the temperature within the structure as a function of the depth z (in µm) for different durations after the end of the laser pulse.

Figure 6C:
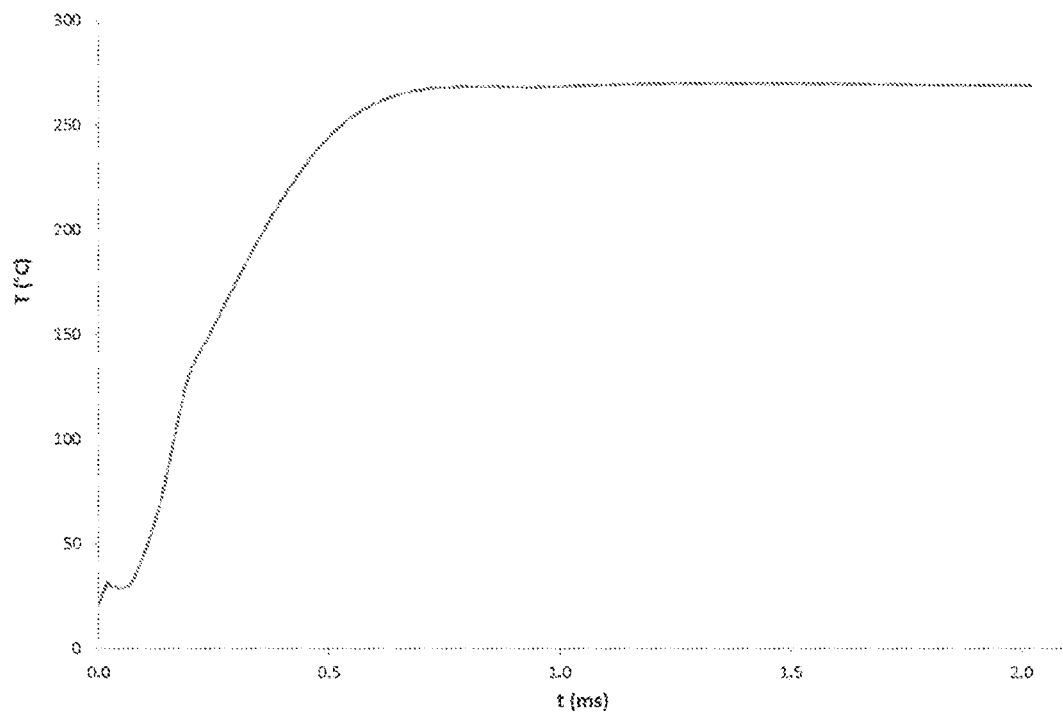

FIG. 6C shows the change in temperature T (in ° C.) at the seed layer as a function of time t (in ms). It can be seen that the temperature does not exceed 275° C., which is a much lower temperature than the temperature starting from which degradation of the electrical properties of graphene is observed.

At the wavelength of 193 nm, SiC exhibits an optical absorption coefficient more than three times higher than that of silicon nitride, while being stable above the dissociation temperature of silicon nitride.

The combination of an optically absorbent layer of SiC 30 nm thick and of a sacrificial layer of $Si_3N_4$ 20 nm thick advantageously replaces a single optically absorbent sacrificial layer of $Si_3N_4$ 100 nm thick used in the prior art.

Figure 7A:
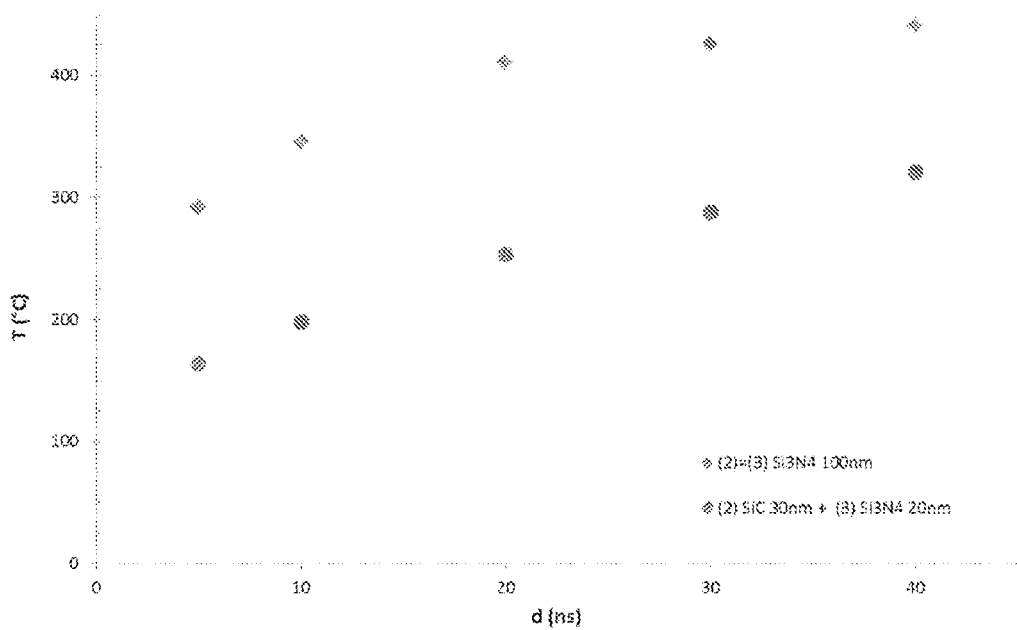
FIGS. 7A and 7B, respectively, illustrate the maximum temperature at the seed layer and the heat required for the separation per unit area as a function of the pulse duration of the light flux, for a known structure (wherein the optically absorbent layer and the sacrificial layer are merged and therefore form a single layer of $Si_3N_4$), and for a structure according to the present disclosure (wherein the optically absorbent layer is made of SiC and the sacrificial layer is made of $Si_3N_4$)

FIG. 7A thus presents the maximum temperature T at the upper interface of the seed layer 8 (in ° C.), for the combination of an optically absorbent layer of 30 nm of SiC and of a sacrificial layer of 20 nm of $Si_3N_4$ according to the present disclosure and for a single optically absorbent sacrificial layer of $Si_3N_4$ 100 nm thick, not in accordance with the present disclosure, as a function of the laser pulse duration d (in ns). It can be seen that the maximum temperature is decreased by more than 100° C. with the structure according to the present disclosure.

Figure 7B:
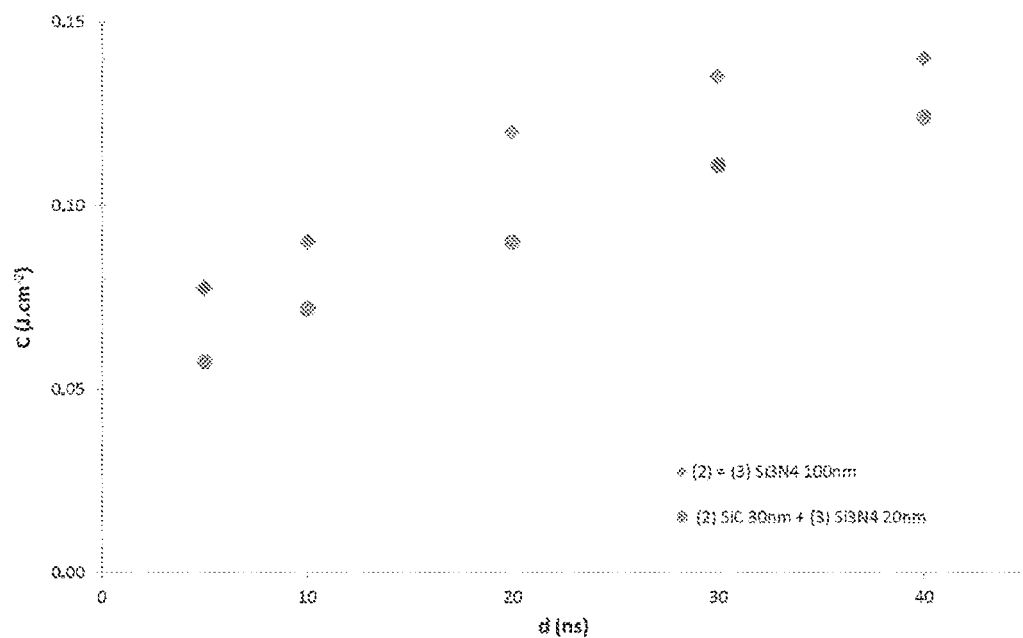

FIG. 7B illustrates the heat C required for detachment per unit area (in $J \cdot cm^{-2}$) as a function of the laser pulse duration d (in ns), for the combination of an optically absorbent layer of 30 nm of SiC and of a sacrificial layer of 20 nm of $Si_3N_4$ according to the present disclosure and for a single optically absorbent sacrificial layer of $Si_3N_4$ 100 nm thick, not in accordance with the present disclosure. It can be seen that the heat required is decreased by nearly 0.02 $J \cdot cm^{-1}$ with the present disclosure, i.e., a decrease of approximately 14%.

Figure 7C:
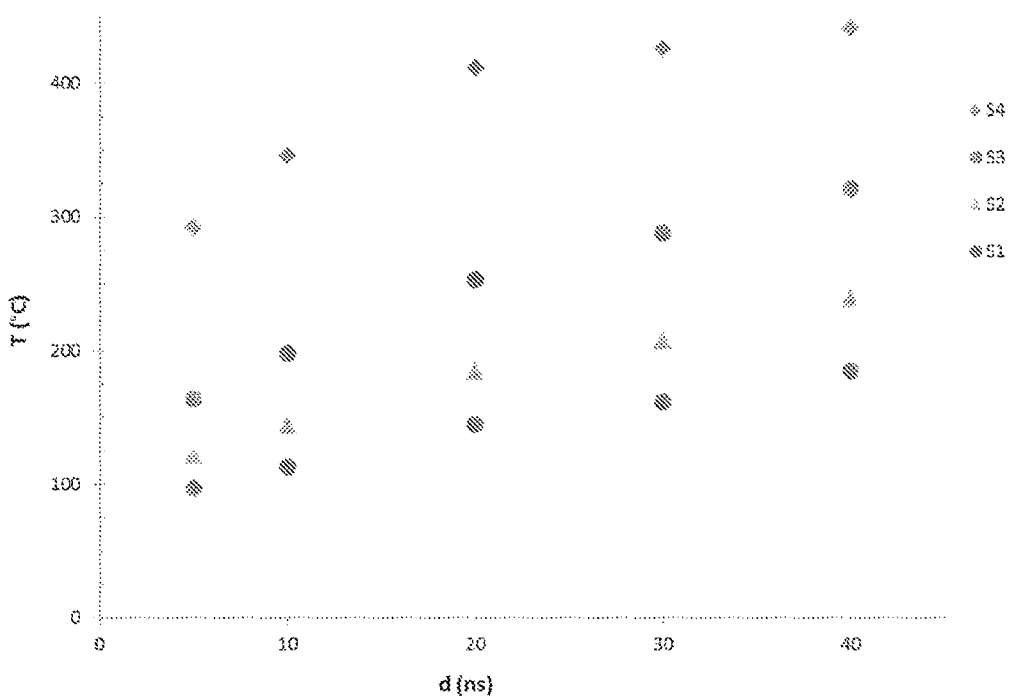
FIG. 7C shows the maximum temperature at the seed layer as a function of the pulse duration of the light flux, for different compositions of the first type of composite structure.

Furthermore, FIG. 7C illustrates results of numerical simulations for various composite structures.

The structures S1, S2 and S3 are in accordance with the present disclosure. They all successively comprise the substrate 1 of sapphire, the first thermal barrier layer 5 made of $SiO_2$, the optically absorbent layer 2 made of SiC, the sacrificial layer 3 made of $Si_3N_4$, the second thermal barrier layer 5 and a layer of nickel, constituting a seed layer 8 for the graphene layer 4 to be separated (unless otherwise indicated, the thickness of each of the layers is that mentioned above). The structures S1 and S2 further comprise a thermal inertia layer 7 made of polycrystalline silicon between the second thermal barrier layer 5 and the seed layer 8; in the case of the structure S1, the thickness of the layer 7 is 1,000 nm; in the case of the structure S2, the thickness of the layer 7 is 500 nm.

The structure S4 is not in accordance with the present disclosure: it comprises a single optically absorbent sacrificial layer of $Si_3N_4$ 100 nm thick between first and second thermal barrier layers, which are identical to those of the structures Si to S3.

It can be seen that the maximum temperature decreases with increasing thickness of the thermal inertia layer 7. Thus, for the structure S2, comprising a thermal inertia layer 7 that is 500 nm thick, the maximum temperature is lower than 200° C. for a pulse of 20 ns. In this case, the thermal inertia film provides 43% of additional surface heat capacity (in $J \cdot K^{-1} \cdot m^{-1}$) with respect to all of the layers 3, 5 and 8.

Example n° 2

This second example relates to a composite structure allowing the deposition of a layer of PZT (lead zirconate titanate) on a silicon substrate followed by the transfer of the layer to a flexible carrier. Such a layer exhibits ferroelectric, piezoelectric and/or pyroelectric properties.

The composite structure comprises successively, with reference to FIG. 1B (not all of the layers shown in FIG. 1B necessarily being present in the structure):
- a substrate 1 of silicon 500 µm thick;
- a first thermal barrier layer 5 made of $SiO_2$ 500 nm thick;
- an optically absorbent layer 2 made of molybdenum 100 nm thick;
- a sacrificial layer 3 made of titanium and indium oxide (ITO) 20 nm thick;
- a second thermal barrier layer 5 made of $SiO_2$ 500 nm thick;
- a layer 4 of PZT 1 µm thick.

In order to obtain satisfactory properties, the layer 4 must be heated to 600° C.

After this step, a flexible carrier in the form of a polyimide film is bonded to the PZT layer in order to transfer the layer thereto. The maximum temperature that the polyimide film can withstand is between 200 and 400° C. depending on the duration of application of the temperature.

To separate the composite structure, a $CO_2$ laser emitting infrared, for example, having a wavelength of 10.6 µm is used.

Figure 8A:
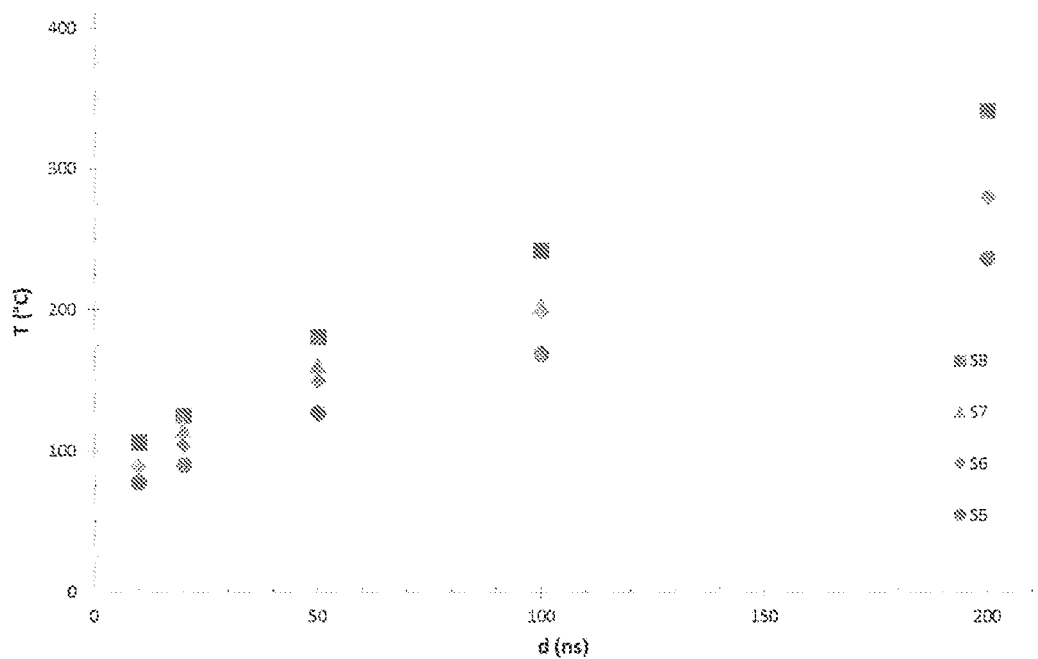
FIGS. 8A and 8B, respectively, show the maximum temperature at the interface between the layer to be transferred and the carrier, and the power to be transmitted through the substrate in order to dissociate the sacrificial layer, as a function of the pulse duration, for different compositions of a second type of composite structure.

FIG. 8A illustrates the maximum temperature (in ° C.) at the bonding interface as a function of the laser pulse duration (in ns), for different composite structures S5-S8.

The limit temperature of 200° C. is exceeded if the pulse duration is longer than 50 ns.

If the power of the laser source is not sufficient, it is possible to provide a transfer with a longer pulse (100 nm, for example) by increasing the thickness of the thermal barrier layers 5 and/or by inserting a heat distribution film 7 in order to increase the heat capacity of the layers between the sacrificial layer 3 and the bonding interface between the layer 4 of PZT and the carrier.

The structures S5, S6, S7 and S8 are in accordance with the present disclosure. They all successively comprise the substrate 1 of silicon, the first thermal barrier layer 5 made of $SiO_2$, the optically absorbent layer 2 made of molybdenum, the sacrificial layer 3 made of ITO, the second thermal barrier layer 5 and a layer 4 of PZT of 1 constituting the layer to be separated (unless otherwise indicated, the thickness of the layers is that mentioned above). The structures S5 and S6 further comprise a thermal inertia layer 7 made of polycrystalline silicon between the second thermal barrier layer and the seed layer 8; in the case of the structure S5, the thickness of the layer 7 is 1,000 nm; in the case of the structure S6, the thickness of the layer 7 is 500 nm. In comparison with the structure S8, the second thermal barrier layer of the structure S7 is thicker (1,000 nm instead of 500 nm).

Figure 8B:
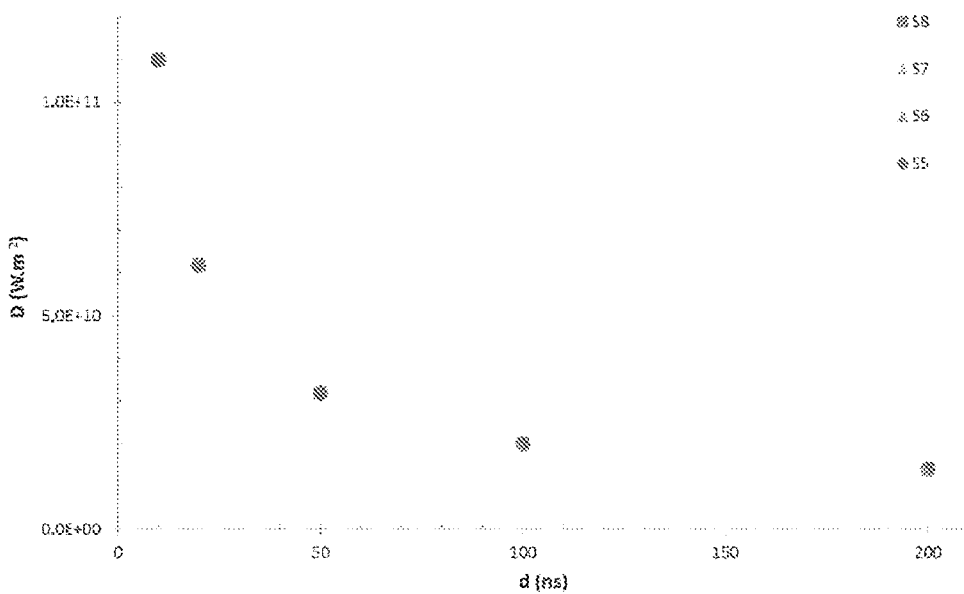

FIG. 8B illustrates the power density D of the laser (in $W \cdot m^{-2}$) to be transmitted through the silicon substrate in order to dissociate the sacrificial layer, as a function of the laser pulse duration (in ns), for the structures S5-S8 mentioned above. The points are substantially coincident for all of the structures.

Figure 9A:
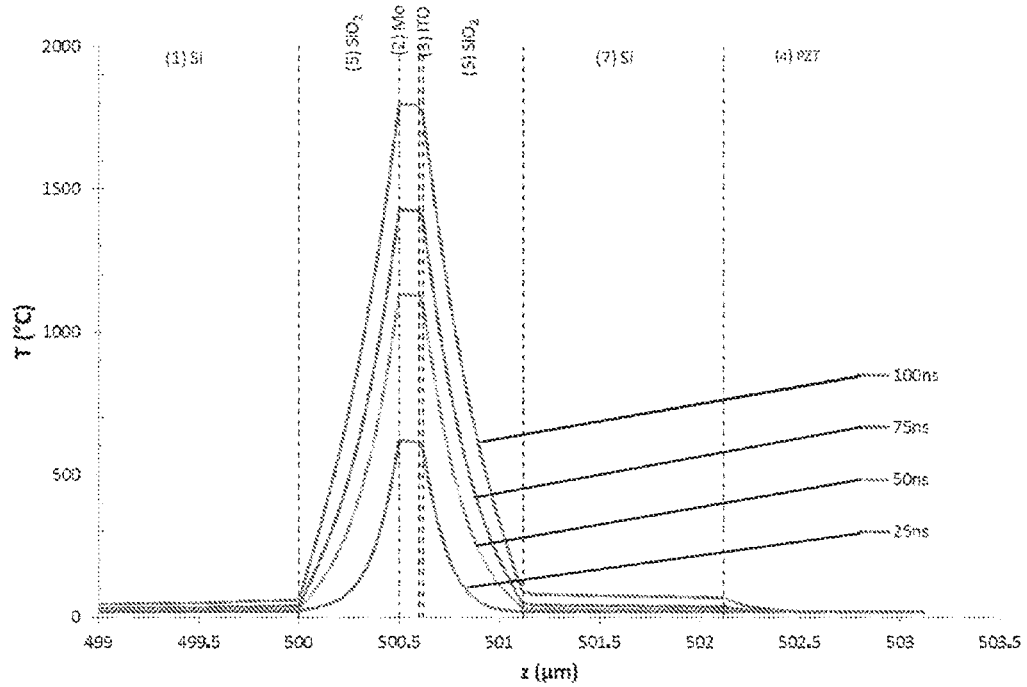
FIGS. 9A to 9C show thermal simulation results showing, respectively, the heating within the dismantlable composite structure during a pulse of the light flux and the homogenization of the temperature within the composite structure after the dissociation of the sacrificial layer, for different pulse durations, and the change in temperature at the interface between the seed layer and the layer to be separated over time, during and after a pulse of the light flux.

FIG. 9A shows the distribution of the temperature within the composite structure S5 as a function of the depth z (in µm) for different durations shorter than or equal to the laser pulse duration, which is 100 ns in this case.

Figure 9B:
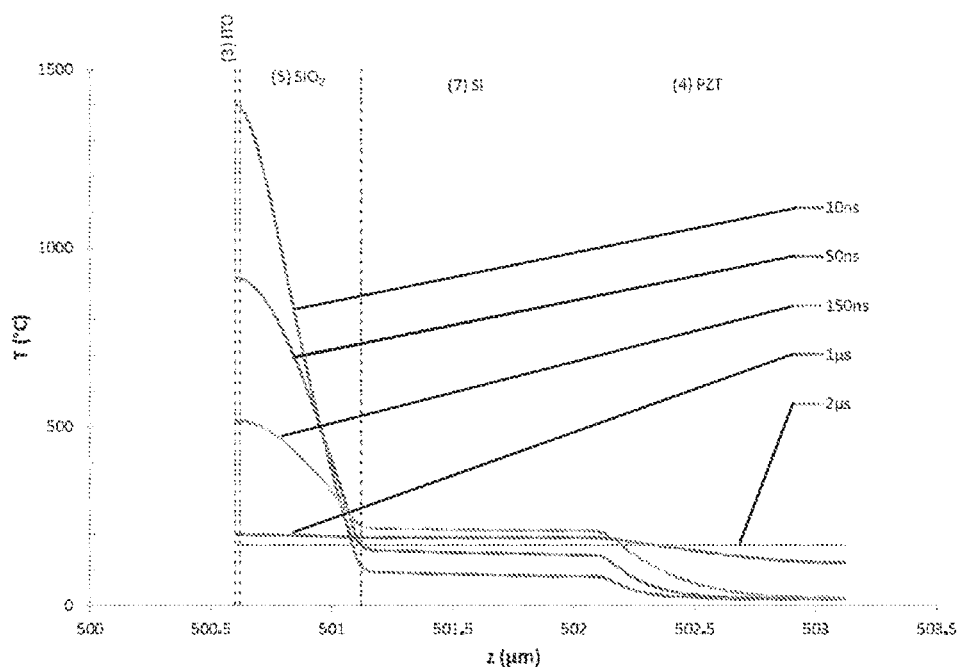

FIG. 9B shows the homogenization of the temperature within the structure S5 as a function of the depth z (in µm) for different durations after the end of the laser pulse.

Figure 9C:
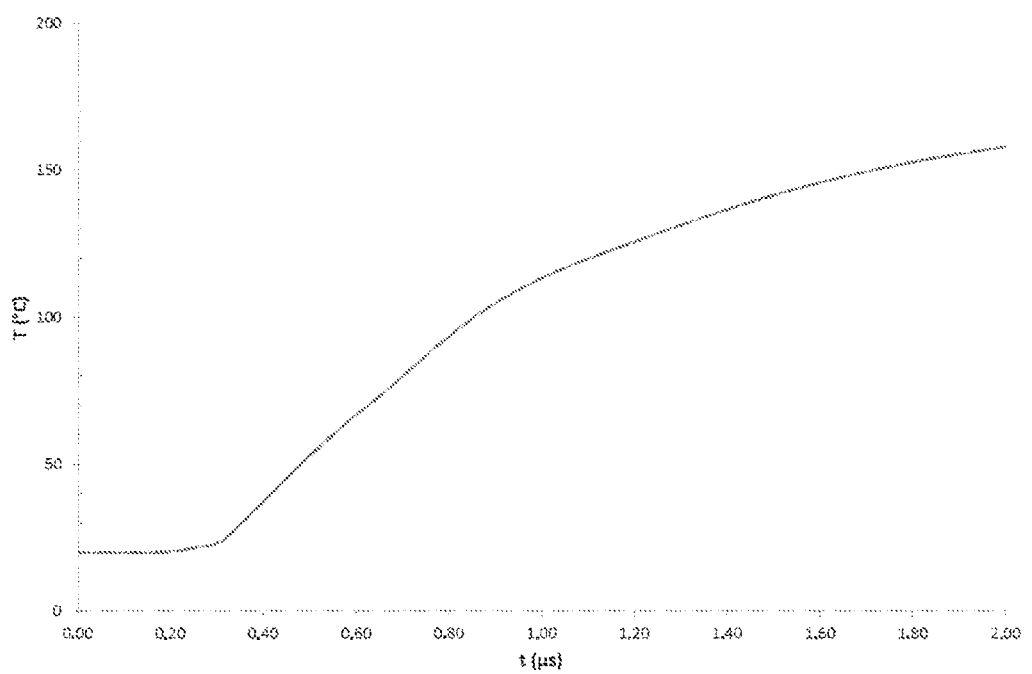

FIG. 9C shows the change in temperature T (in ° C.) at the upper interface of the PZT layer of the structure S5 as a function of time t (in µs). It can be seen that the temperature does not exceed 180° C., such that the polyimide carrier bonded to the PZT layer does not run the risk of being damaged during the separation method.

Of course, the examples described above are provided only by way of illustration and are not limiting.

The invention claimed is:

1. A method for separating a composite structure that is dismantlable by application of a light flux, the method comprising:
    providing the dismantlable composite structure comprising successively:
        a substrate;
        a first thermal barrier layer;
        an optically absorbent layer comprising a material suitable for at least partially absorbing a light flux, the substrate and the first thermal barrier layer being substantially transparent to the light flux;
        a sacrificial layer suitable for dissociating under the application of a temperature higher than a dissociation temperature, made of a material different from that of the optically absorbent layer;
        at least one layer to be separated;
    applying a light flux through the substrate, the light flux being absorbed at least in part by the optically absorbent layer, so as to heat the optically absorbent layer;
    heating the sacrificial layer by thermal conduction from the optically absorbent layer, up to a temperature higher than or equal to the dissociation temperature; and
    dissociating the sacrificial layer under the effect of the heating.

2. The method of claim 1, wherein a product of a thickness of the substrate and of a coefficient of absorption of the light flux by the substrate is less than 0.1.

3. The method of claim 1, wherein the product of the thickness of the optically absorbent layer and of the coefficient of absorption of the light flux by the optically absorbent layer is greater than 2.3.

4. The method of claim 1, further comprising pulsing the light flux.

5. The method of claim 1, wherein a wavelength of the light flux is between 100 and 12,000 nm.

6. The method of claim 1, further comprising, before the application of the light flux, bonding the composite structure to a carrier, the dissociation of the sacrificial layer leading to a transfer of the layer to be separated to the carrier.

7. The method of claim 6, wherein the carrier comprises at least one of the following materials:
    a semiconductor material;
    a metal; or
    a polymer.

8. The method of claim 1, wherein the sacrificial layer is in contact with the optically absorbent layer.

9. The method of claim 1, wherein the sacrificial layer is substantially transparent to the light flux.

10. The method of claim 1, further comprising, after dissociating the sacrificial layer, substantially completely removing the sacrificial layer from the at least one layer to be separated.

11. The method of claim 1, wherein the structure further comprises a second thermal barrier layer located between the sacrificial layer and the layer to be separated.

12. The method of claim 11, wherein the first and/or the second thermal barrier layer has a linear thermal conductivity coefficient of less than 10 W $m^{-1}$ $K^{-1}$.

13. The method of claim 11, wherein the first and/or the second thermal barrier layer comprises at least one of the following materials: silica ($SiO_2$) or alumina ($Al_2O_3$).

14. The method of claim 1, further comprising a first film suitable for reflecting or absorbing the light flux, the first film located between the sacrificial layer and the layer to be separated.

15. The method of claim 14, wherein the first film comprises at least one of the following materials: silicon, silica ($SiO_2$), silicon carbide (SiC), molybdenum, or silicon nitride ($Si_3N_4$).

16. The method of claim 14, further comprising, between the sacrificial layer and the layer to be separated, a second film suitable for distributing the heat over the entire area of the structure.

17. The method of claim 16, wherein the second film comprises at least one of the following materials: alumina ($Al_2O_3$), silica ($SiO_2$), polycrystalline aluminum nitride (AlN), or polycrystalline silicon.

18. The method of claim 1, wherein the substrate comprises at least one of the following materials: sapphire or quartz.

19. The method of claim 1, wherein the optically absorbent layer comprises at least one of the following materials: silicon nitride ($Si_3N_4$), polycrystalline silicon, or polycrystalline silicon carbide (SiC).

20. The method of claim 1, wherein the sacrificial layer comprises at least one of the following materials: silicon nitride ($Si_3N_4$), polycrystalline aluminum nitride (AlN), polycrystalline gallium nitride (GaN), or indium tin oxide (ITO).

21. The method of claim 1, wherein the layer to be separated comprises at least one of the following materials:

a metal;

a group IV material having a hexagonal crystal structure;

a piezoelectric, ferromagnetic or ferroelectric material; or a phase-change alloy.

* * * * *